United States Patent
Boyd et al.

(10) Patent No.: US 6,221,562 B1
(45) Date of Patent: Apr. 24, 2001

(54) RESIST IMAGE REVERSAL BY MEANS OF SPUN-ON-GLASS

(75) Inventors: Diane C. Boyd, Lagrangeville, NY (US); Toshiharu Furukawa, Essex Junction; Steven J. Holmes, Milton, both of VT (US); William H. Ma, Fishkill, NY (US); Paul A. Rabidoux, Winooski; David V. Horak, Essex Junction, both of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/192,137

(22) Filed: Nov. 13, 1998

(51) Int. Cl.$^7$ .................................................. G03F 7/00
(52) U.S. Cl. ........................... 430/314; 430/323; 430/324
(58) Field of Search .................................. 430/314, 323, 430/324

(56) References Cited

U.S. PATENT DOCUMENTS

| | | | |
|---|---|---|---|
| 4,774,164 | * 9/1988 | Peavey | 430/296 |
| 5,077,236 | 12/1991 | Kim | 437/192 |
| 5,312,512 | 5/1994 | Allman et al. | 156/636 |
| 5,451,543 | 9/1995 | Woo et al. | 437/195 |
| 5,543,252 | 8/1996 | Shibata et al. | 430/5 |
| 5,605,783 | 2/1997 | Revelli et al. | 430/321 |
| 5,618,383 | 4/1997 | Randall | 430/314 |
| 5,652,182 | 7/1997 | Cleeves | 437/195 |
| 5,653,851 | 8/1997 | Shelton | 216/67 |
| 6,017,810 | * 1/2000 | Furukawa | 438/592 |
| 6,096,458 | * 8/2000 | Hibbs | 430/5 |

FOREIGN PATENT DOCUMENTS 2-214126 * 8/1990 (JP).

* cited by examiner

Primary Examiner—Mark F. Huff
Assistant Examiner—Nicole Barreca
(74) Attorney, Agent, or Firm—Eugene I. Shkurko

(57) ABSTRACT

An image reversal method of turning hybrid photoresist spaces into resist lines for sub-feature size applications. The sub-feature size space width of the high resolution hybrid photoresist is largely independent of the lithographic process and mask reticles. These sub-feature size spaces formed by the hybrid resist are then turned into sub-feature size lines using Spin-On-Glass, SOG. The SOG is first coated over the entire patterned hybrid resist to fill in the hybrid spaces and cover the photoresist. SOG is then recessed back to expose the photoresist layer. The exposed photoresist is then removed. The sub-feature size lines are then left behind as a mask to pattern the same onto the underlying films on the substrate.

1 Claim, 2 Drawing Sheets

RESIST IMAGE REVERSAL BY MEANS OF SPUN-ON-GLASS

CROSS-REFERENCE TO RELATED APPLICATIONS

U.S. patent applications Ser. No. 08/715,287, now U.S. Pat. No. 6,114,082, entitled "Frequency Doubling Hybrid Photoresist", filed Sep. 16, 1996, and Ser. No. 09/170,756, entitled "Optimization of Space Width for Hybrid Photoresist", filed Oct. 13, 1998, are assigned to the same assignee hereof and contain subject matter related, in certain respect, to the subject matter of the present application. The above-identified patent applications are incorporated herein by reference.

BACKGROUND OF THE INVENTION

1. Technical Field of the Invention

This invention pertains to semiconductor IC processing. In particular, this invention provides a method for achieving small line width control over semiconductor dimensions, thereby achieving greater feature density during IC manufacturing.

2. Background Art

It is an object of the present invention to convert a photoresist space pattern into a photoresist line pattern. An example of this is the use of a hybrid photoresist space image for gate conductor applications. A subtractive etch is currently used to form the gate, which requires a photoresist line rather than a photoresist space. In order to form the gate conductor from the hybrid space, the space must be converted to a line.

Previously used processes etched the photoresist space into a hard mask, then filled the hard mask with another material, such as silicon oxide. The oxide film is then polished, and the nitride hard mask stripped. The polished oxide can then be used to mask the gate conductor etch.

SUMMARY OF THE INVENTION

By means of our invention, we can take the sub-critical high-resolution space of a hybrid photoresist and turn it into a line. The line, formed in the manner of the present invention, can be used to mask a subtractive etch process on the substrate. The preferred application for this process at the present time is for conventional gate structure formation, in which a small channel length and high channel uniformity would provide a large beneficial gain.

Our solution is to apply a spun-on-glass oxide film over the photoresist. The spun-on-glass can be of the conventional spin-on type, or it can also be of the new plasma deposited type. The plasma deposition might be more reliable from the point of view of repeatability of applied thickness over time, and reduced defects due to shelf-life degradation of conventional spun-on-glass. This spun-on-glass material is desirable for this application because it fills very narrow openings well, leaving a minimal amount of material on the top of the topography. It can also be cured to a solid at relatively low temperatures of 150–170° C., which is compatible with avoiding photoresist degradation. After curing at these temperatures, the surface oxide can be etched, and the photoresist stripped, to leave an oxide line in place of the photoresist space. The oxide mask can then be used to etch the substrate, such as a gate conductor feature.

A gate structure formed in this manner is uniquely characteristic of a hybrid photoresist. It has a unique resolution and uniformity relative to conventional gate structures, since it does not have the normal image size distribution due to expose variation and mask variation present in conventional structures. It also provides unique image placement advantages, as the expose variation and mask variations typically present problems for image placement.

The present solution also eliminates an etch step, a polish step, and the nitride strip required in the hard mask process mentioned above. Other features and advantages of this invention will become apparent from the following detailed description of the presently preferred embodiment of the invention, taken in conjunction with the accompanying drawings.

BEST MODE FOR CARRYING OUT THE INVENTION

Hybrid Photoresist

The purpose of the present invention is to advantageously turn a photoresist space into a photoresist line. A preferred photoresist for use with the present invention includes IBM's hybrid photoresist, which resist is described in the filed applications identified above and incorporated herein by reference. Commonly available conventional photoresists are also operable for the present invention, and the methods for their use are described below in the section entitled "Conventional Photoresist". This section will focus on the present inventive method implementing the preferred hybrid photoresist.

Figure 1A:
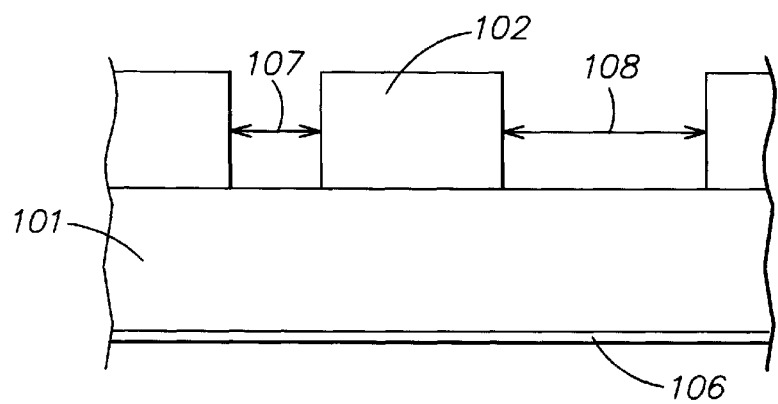
FIGS. 1A–D illustrate the process of the present invention.

With a hybrid photoresist, which prints two spaces in photoresist for each reticle feature, one at each edge of the reticle opening, rather than one space for each reticle feature, the space can be printed at a fraction of the size that can normally be printed with conventional positive or negative tone photoresists. In the example of FIG. 1A, the dimension 107 can be effectively formed using hybrid photoresist at about 0.06 to 0.16 microns (drawings are not to scale). One of the desirable aspects of this hybrid photoresist process is that the width of the high resolution photoresist space is largely independent of expose dose and reticle width (since the hybrid prints the edge of the aerial image as a space, and the edge does not change substantially as expose dose or reticle size are altered, within appropriate limits), which also leads to improved uniformity of feature dimensions. The high resolution feature of the hybrid photoresist cannot generally be printed as a line. By means of our invention, we can take the sub-critical high-resolution space of a hybrid photoresist and turn it into a line. The line, formed in the manner of the present invention, can be used to mask a subtractive etch process on the substrate. The preferred application for this process at the present time is for conventional gate structure formation, in which a small channel length and high channel uniformity would provide a large beneficial gain. However, the present invention could be applied to any device features.

FIGS. 1A–D show an example method of implementing the present invention. FIG. 1A shows a patterned layer of photoresist 102, which can be applied to a substrate layer 101 (formed on a gate dielectric layer 106) by spinning the substrate at several thousand RPM depending on photoresist viscosity, to a depth approximately from about 0.3 to 0.6 microns, as a typical example. The method of depositing the photoresist is not crucial to the invention, hence, other photoresist techniques such as dry film deposition can be used. The desired feature dimension 107 (and/or 108) has been established as a space, using common techniques, which will be converted into a line.

Figure 1B:
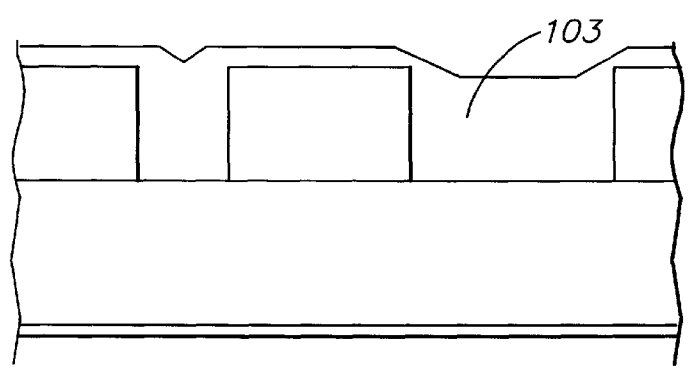

After the photoresist is applied, exposed, and developed, to the achieve the pattern of FIG. 1A, it may be hardened and stabilized via various techniques, such as baking or UV exposure, but this hardening step is not required to implement the present invention. Referring to FIG. 1B, glass 103 is applied next via a similar processes as the photoresist. Typical spun-on glass material include various low molecular weight materials containing polymer, silicon, oxygen, and hydrocarbon species. Typically, the SOG is applied as an aqueous solvent, but can be alcohol solvent based. The glass layer is applied by spinning, then it is baked (typical temperature about 150° C. or so) for cross-linking and stabilizing the SOG and, at the same time, avoiding decomposition of the photoresist (which would begin at about 200° C. or higher).

In a deposition process, the silicon dioxide is formed from methylsilane and hydrogen peroxide. This is a well known process described and sold by Trikon Technologies, Inc., Lindenhurst, N.Y.; Arlington, Tex.; and Santa Clara, Calif.. This deposition actually occurs at very low temperatures, 0° C. After deposition, the film is cured by heating at 100–150° C. This type of temperature range is compatible with photoresist (provided the photoresist has been UV hardened). For some photoresists, a 150° C. bake is not a problem, such as for the negative tone pattern we describe in conjunction with the phase edge expose (under "Conventional Photoresist"). For other photoresists, a hardening step needs to be included, which can include a high energy, blanket UV expose in combination with a bake, usually ramped from 100° C. to 200° C. The Trikon material is desirable because it fills spaces very well, leaving very little material on top of the photoresist. An acceptable process would fill features spaces without voids and leave a substantially planar top surface. Hence, a spun-on-glass technique is preferred. SOG fills narrow openings very well due to its advantageous viscosity, leaves a minimal amount of material on top of the previously applied photoresist, is compatible with resist processes, bakes at low temperatures, and doesn't attack resist materials. The depth of SOG over the photoresist areas must be less than the depth of SOG in the spaces so that when SOG is etched the photoresist areas are exposed and SOG remains in the spaces. If the spaces become too large the thickness of SOG in the center of the spaces might become shallow enough such that a subsequent SOG etch will expose the substrate layer underneath.

Figure 1C:
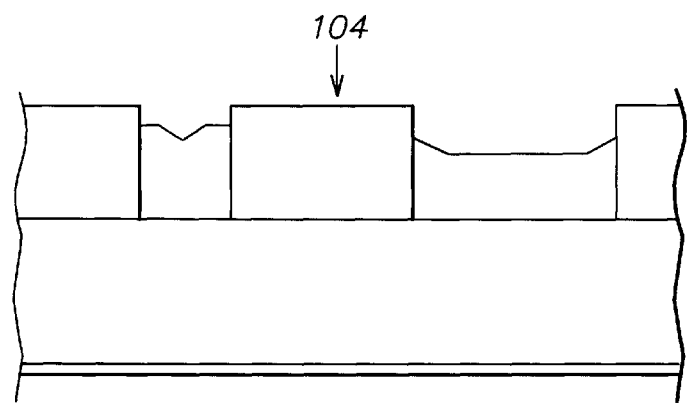

Referring to FIG. 1C, etching 104 the SOG leaves exposed photoresist features while leaving SOG in the spaces between photoresist. Usable etching processes include plasma RIE and chlorine or fluorine etchants. A timed etching step here, or an end point detect scheme would achieve sufficiently good results. The SOG etch step is complete when the SOG is cleared from the tops of the photoresist regions. Sputtering effects of a plasma etch may tend to round newly exposed corners of the photoresist as the SOG layer becomes recessed below the top of the photoresist layer (not shown). Etch processes consistent with oxide etching would also be sufficient for this SOG etching step. Further etching parameters are typically described and included with commonly available etching tools. An end point detect scheme might detect changes in the presence of carbon gases, or fluorine or chlorine content change in the plasma, for example.

Figure 1D:
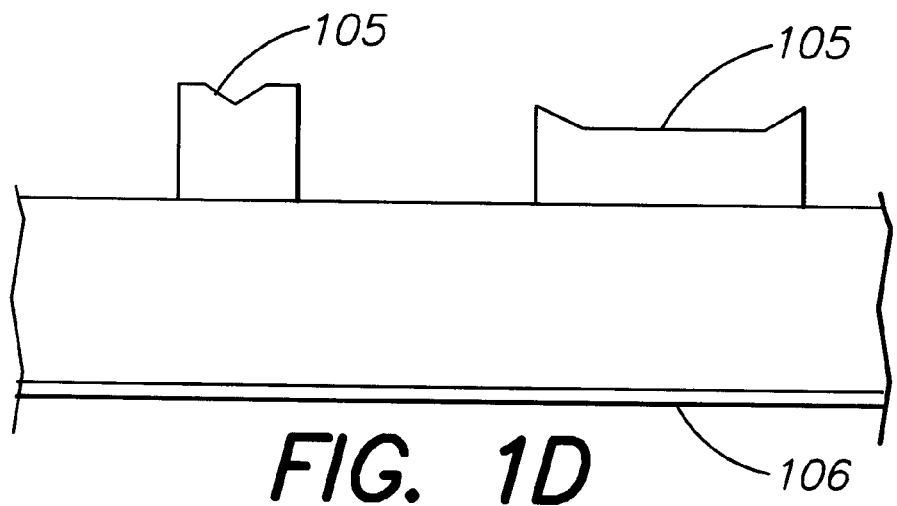

Referring to FIG. 1D, the photoresist is stripped using conventional photoresist strip processes leaving the patterned SOG on the surface of the substrate layer which will serve as a substrate etch mask. Off the shelf standard oxygen plasma strip, or ozone strip photoresist tools would be useful for this step. Standard, commonly available strip tools maintain correct process temperatures and include end point detection features. Thus, by the method described above, the photoresist spaces 107 and 108 have been converted to SOG lines 105.

Figure 2:
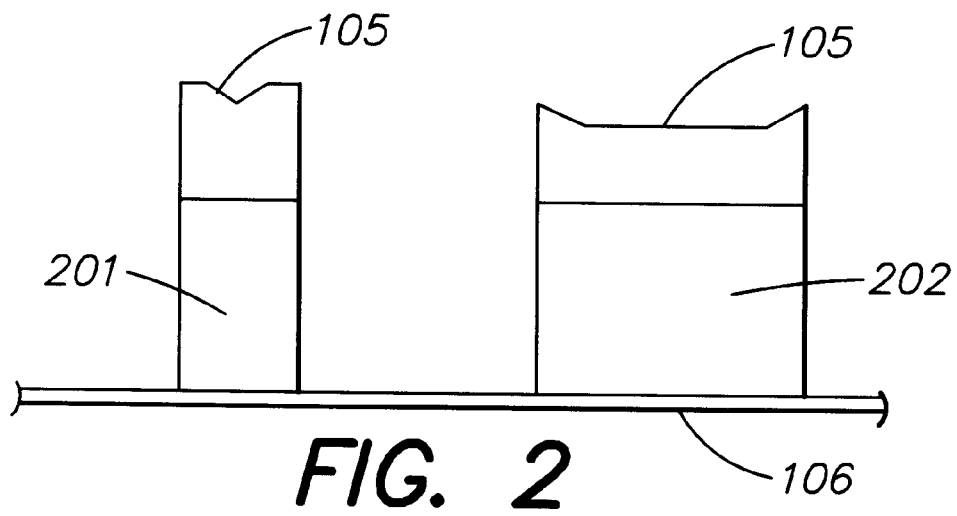
FIG. 2 illustrates an example cross section of the desired final structure prior to conventional device processing.

Referring to FIG. 2, a substrate etchant is used having a sufficient poly/oxide etch ratio to bore into the substrate to a desired depth while leaving sufficient SOG on the substrate surface for protection in desired areas. In the present example, a directional etch is used to remove the substrate material down to the gate dielectric layer 106. Chlorinated or brominated compounds can be used to directionally etch the substrate material leaving the narrow dimensioned SOG on its surface with a corresponding narrow substrate region beneath it. After removing the narrow SOG portion on top, the narrow substrate region can be used to form a gate conductor for a transistor device.

At this point, shown in FIG. 2, using the narrow dimensioned poly 201 and/or 202 as gate regions, conventional device processing may be undertaken, such as source/drain implants, spacer formation, etc. Such conventional fabrication methods are well known and will not be described further.

Conventional Photoresist

An alternative operable method for carrying out the present invention includes using commonly available photoresists. The steps are similar to that of the hybrid photoresist method described above and can be followed for conventional photoresists by one skilled in the art. The image reversal process of the present invention effectively reverses the tone of the photoresist pattern, so for a conventional positive or negative photoresist, one would choose to print in the opposite tone relative to that which is desired to be etched into the substrate. If positive tone photoresist is used with 193 nm wavelength radiation, for example, and there is no available comparable negative tone photoresist, it may be necessary to use such a process to image a negative form in 193 nm. For line width control purposes, such as a gate conductor application, if only positive tone photoresist was available, you could use this method to turn it into a negative tone and get better isolated line width control. Examples of suitable photoresists include APEX, UVIIHS, and UV6 brands from Shipley Company, located in Marlborough, Mass., or IBM's UV2 photoresist. Reticle techniques such as phase-shift lithography or phase-edge expose processes can be used with negative photoresist to achieve narrowly spaced feature widths.

Following the steps as described above for the hybrid photoresist process, in the example of FIG. 1A, dimensions 107 and/or 108 are formed in conventional positive or negative tone resist. The photoresist is applied, as above, by spinning the substrate at several thousand RPM depending on photoresist viscosity, to a depth approximately from about 0.3 to 0.6 microns, as a typical example. The desired feature dimensions 107 and 108 have been established as spaces, using common expose and develop techniques, and will be converted into substrate lines.

Per FIG. 1B, glass is applied next via processes as described above. Per FIG. 1C, etching the SOG leaves exposed photoresist features while leaving SOG in the spaces between photoresist. Usable etching processes include plasma RIE and chlorine or fluorine etchants. Per FIG. 1D, the photoresist is stripped using conventional photoresist strip processes. Off the shelf standard oxygen plasma strip, or ozone strip photoresist tools would be useful for this step. Per FIG. 2, an etchant is used having a sufficient poly/oxide etch ratio to bore into the substrate to a desired depth while leaving sufficient SOG on the substrate surface for protection in desired areas. Chlorinated or brominated compounds can be used to directionally etch the substrate material leaving the narrow dimensioned SOG on its surface with a corresponding narrow substrate region beneath it. At this point, shown in FIG. 2, using the narrow dimensioned poly as a gate region, conventional processing may be undertaken.

Alternative Embodiments

The matter contained in the above description or shown in the accompanying drawings have been described for purposes of illustration and shall not be interpreted in a limiting sense. It will be appreciated that various modifications may be made in the above structure and method without departing from the scope of the invention described herein. Thus, changes and alternatives will now become apparent to those skilled in the art without departing from the spirit and scope of the invention as set forth in the following claims. Accordingly, the scope of protection of this invention is limited only by the following claims and their equivalents.

What is claimed is:

1. A method comprising the steps of:

a) applying a hybrid photoresist layer on a substrate;

b) forming patterned openings each having a sub-critical width in the hybrid photoresist layer down to the substrate;

c) disposing a glass layer over the hybrid photoresist layer and into the sub-critical openings down to the substrate;

d) removing the glass layer from over the hybrid photoresist layer for exposing the hybrid photoresist layer, including leaving the glass layer in the sub-critical openings on the substrate;

e) removing the hybrid photoresist layer exposed by step d) down to the substrate for exposing the substrate that was beneath the hybrid photoresist layer, and for converting the glass layer in the sub-critical openings into a pattern of sub-critical glass layer lines; and f) removing substrate material that was beneath the hybrid photoresist layer using the sub-critical glass layer lines as a mask for forming sub-critical features in the substrate material.

* * * * *